United States Patent [19]
Dosdall et al.

[11] Patent Number: 6,144,265
[45] Date of Patent: Nov. 7, 2000

[54] CALIBRATED HIGH POWER RADIO FREQUENCY STEP ATTENUATOR

[75] Inventors: Charles Louis Dosdall, Scottsdale; James R. Troxel, Glendale, both of Ariz.

[73] Assignee: Honeywell Inc., Minneapolis, Minn.

[21] Appl. No.: 08/978,533

[22] Filed: Nov. 26, 1997

[51] Int. Cl.⁷ .................................................... H03H 7/24
[52] U.S. Cl. ..................... 333/17.1; 324/616; 333/81 A
[58] Field of Search ............................. 333/81 R, 81 A, 333/17.1; 327/308

[56] References Cited

U.S. PATENT DOCUMENTS

| | | | |
|---|---|---|---|
| 4,103,223 | 7/1978 | Weinert | 324/616 |
| 4,219,770 | 8/1980 | Weinert | 324/616 X |
| 4,942,375 | 7/1990 | Petitjean et al. | 333/81 R |

FOREIGN PATENT DOCUMENTS

| | | | |
|---|---|---|---|
| 146415 | 6/1989 | Japan | 333/81 R |
| 1293773 | 2/1987 | U.S.S.R. | 333/81 R |

*Primary Examiner*—Paul Gensler
*Attorney, Agent, or Firm*—Snell & Wilmer L.L.P.

[57] ABSTRACT

A high power radio frequency(RF) precision step attenuator includes a trim attenuator, a multi-step attenuator and a calibration/control circuit. The control circuit includes a memory for storing attenuator specific calibration data. The calibration data incorporates attenuator characteristics which are used by the control circuit to adjust the attenuator and compensate for manufacturing variances, temperature variations, and the like.

8 Claims, 2 Drawing Sheets

CALIBRATED HIGH POWER RADIO FREQUENCY STEP ATTENUATOR

BACKGROUND OF INVENTION

The present invention relates generally to attenuator circuits and more specifically to high power precision step attenuator circuits.

High power step attenuators are used in various applications and are particularly difficult to design and build efficiently. For example, one application which uses such attenuators are traffic alert and collision avoidance systems (TCAS) which are used on aircraft. In TCAS systems the attenuators are known as Whisper/Shout attenuators.

These Whisper/Shout attenuators are required to attenuate a transmitted signal in excess of 1 kilowatt peak power, monotonically from 0 dB to 27 dB in 1±0.5 dB increments. The attenuator must meet these specifications over a temperature range of −55 degrees Celsius to +70 degrees Celsius and at altitudes up to 55,000 feet.

Present whisper/shout attenuators require the removal and installation of test select components by a trained technician to achieve the required step accuracy. This calibration process is performed at the subassembly level and may be repeated multiple times to meet the specification requirements over temperature. This is not only a time consuming and costly operation, but reliability can be impacted by the unsoldering and soldering of the test select components. Also, this method does not permit dynamic control of calibration such as for temperature changes.

TCAS and other systems which use high power step attenuators would be improved and costs reduced by a design which eliminates the need to remove and install test select components in order to meet specifications.

Clearly there exists the need for an improved high power step attenuation design.

SUMMARY OF THE INVENTION

The invention discloses a calibrated high power RF precision step attenuator including a trim attenuator, a multi-step attenuator, and a calibration/control circuit. The calibration/control circuit(or just control circuit) retains customized calibration data in memory and adjusts the attenuators to compensate for manufacturing variances and changes in temperature or other physical quantities.

The RF attenuator block includes the small dB trim attenuator in series with the conventional multi-step attenuator. The RF attenuator block is designed to have more attenuation steps than are ultimately desired. Each step is, therefore, a fraction of the desired step size. The result is an RF attenuator block with more step resolution than required. The reason for this design will become apparent in the following description.

For the invention to work well, a very accurate low dB attenuator is used as the trim attenuator. The trim attenuator preferably attenuates by one half of a desired step.

During factory test and calibration, a peak power meter and computer are connected to the output of the RF attenuator block. The RF attenuator is caused to cycle through each step of attenuation while the computer records the actual attenuation for each step. The data is then analyzed to select the steps which most closely match the desired attenuation steps. The resulting calibration data is stored in the memory of the control circuit.

In the preferred embodiment, the factory test and calibration described above is repeated for multiple temperatures. The multiple sets of calibration data are stored in the memory of the control circuit. During operation, the control circuit receives a signal from a temperature sensor and is able to select the appropriate set of calibration data for the temperature.

Therefore, the object of the invention is to provide improved high power RF step attenuation.

A feature of the invention is an attenuation circuit operable to generate more attenuation steps than needed for the application.

Another feature of the invention is control circuitry having a calibration memory.

Another feature of the invention is a control circuit which selects an appropriate set of calibration data as a function of a sensor input(e.g. temperature).

An advantage of the invention is reduced costs of manufacture.

Another advantage of the invention is improved operation over an extended temperature range or other physical quantity.

The significant features of the invention are illustrated in the figures and described more fully below.

DETAILED DESCRIPTION

Figure 1:
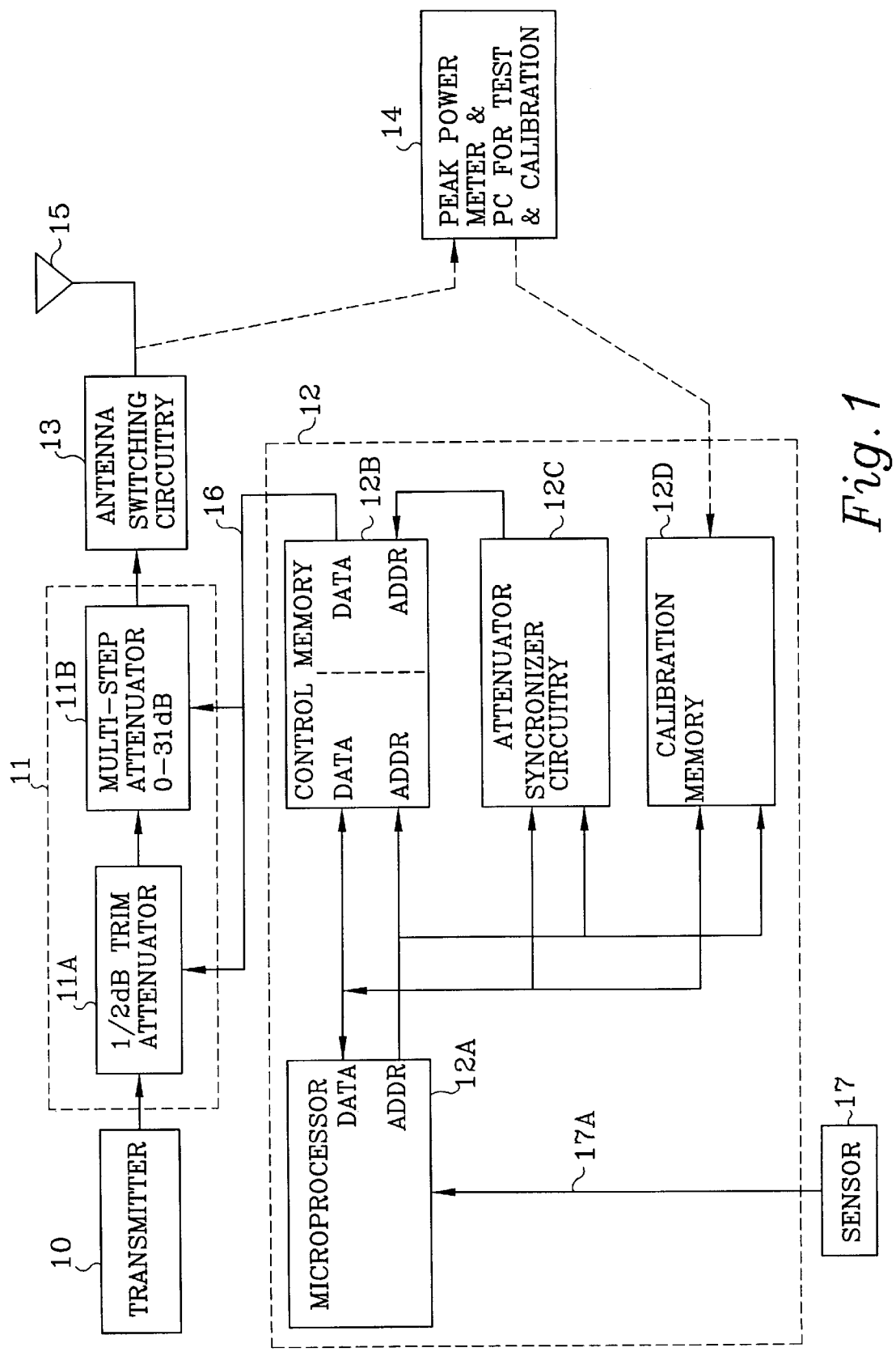
FIG. 1 is a block diagram of the preferred embodiment of the invention.

FIG. 1 is a block diagram of a the preferred embodiment of the invention as used in a TCAS. Shown in FIG. 1 are transmitter 10, RF attenuator block 11, calibration/control circuitry 12, antenna switching circuitry 13, test and calibration unit 14, and antenna 15.

The output of transmitter 10 feeds into RF attenuator block 11. RF attenuator block 11 includes a ½ dB trim attenuator 11A and a conventional 32 step multi-step attenuator 11B. The combination of the trim attenuator 11A and the multi-step attenuator 11B provide 64 steps of attenuation. A TCAS system requires only 27 steps of attenuation. RF attenuator block 11 provides more than twice the required number of steps. The excess steps provide small step increments (i.e. better resolution) which are used to achieve improved performance as discussed below.

The attenuated signal from RF attenuator block 11 feeds into antenna switching circuitry 13. Switching circuitry 13 provides antenna selection(e.g. top or bottom antenna) and directional control as is known in the art. The signal from switching circuitry 13 is output to antenna 15. Antenna 15 may represent multiple antenna located at different locations on the aircraft.

RF attenuator block 11 is controlled by calibration/control circuit 12 via control lines 16. Microprocessor 12A reads calibration data stored in calibration memory 12D and writes it to control memory 12B. Microprocessor 12A is any conventional microprocessor suitable for this task. Calibration memory 12D is preferably an EEPROM capable of storing multiple sets of calibration data.

Control memory 12B is preferably a dual port memory device which facilitates the loading of calibration data on one port and generating attenuator control signals on the other port. Control memory 12B functions as a look-up table where the address from synchronizer circuitry 12C corresponds to the attenuation step number(five bits) and the control memory contains the step attenuator settings(five bits) and trim attenuator settings(one bit).

In operation, when a message is ready to be transmitted, the attenuator synchronizer circuitry 12C selects the desired attenuation step number(0 through 27) which addresses one word in the control memory 12B. The control memory 12B outputs the contents of the selected memory location on control lines 16 to set the trim attenuator 11A and multi-step attenuator 11B prior to the start of transmission by transmitter 10.

Attenuator synchronizer circuitry 12C is also in communication with transmitter 10 and antenna switching circuitry 13 to synchronize their operation with RF attenuator block 11.

Microprocessor 12A is in communication with sensor 17. Sensor 17 communicates a sensor signal 17A representative of a physical quantity which affects attenuator 11 operation. In the preferred embodiment, sensor 17 is a temperature sensor. Microprocessor 12A monitors sensor signal 17A and moves the appropriate set of calibration data from calibration memory 12D to control memory 12B to maintain optimal attenuator system operation.

The calibration method uses a peak power meter in communication with a personal computer 14. Attenuation is measured and stored over the entire range of 64 attenuation steps. The data is sorted in descending order of output power(i.e. ascending attenuation level). The best 27 steps are selected which meet the monotonicity and step size requirements of 1 dB steps ±0.5 dB.

The calibration process is repeated multiple times over the operational temperature range to yield several sets of calibration data, each corresponding to a particular temperature range. The several sets of calibration data are stored into calibration memory 12D.

Figure 2:
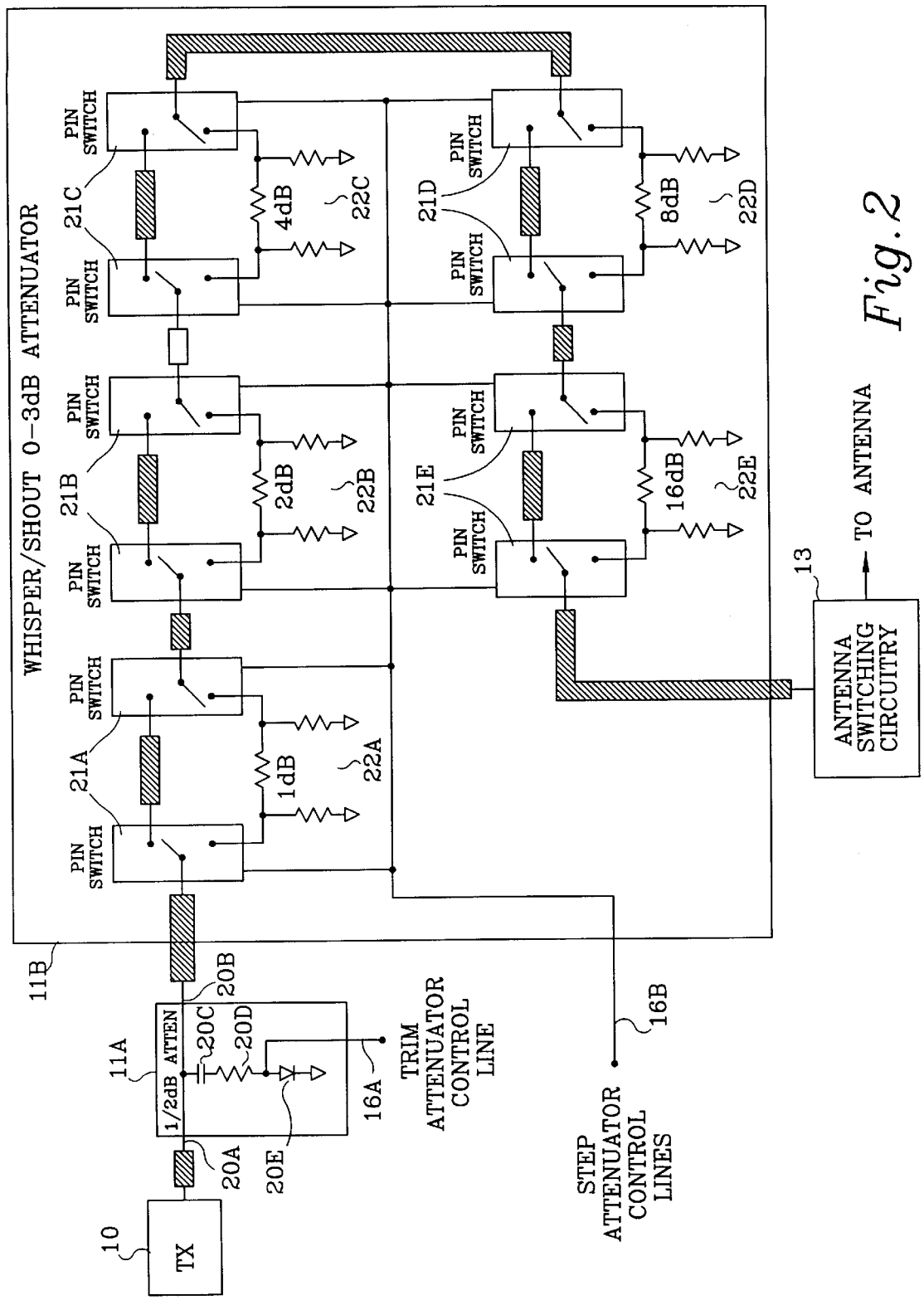
FIG. 2 is the preferred embodiment of the RF attenuation block of the invention.

FIG. 2 shows the preferred embodiment of the RF attenuator block 11 of the invention. Shown in FIG. 2 are transmitter 10, ½ dB trim attenuator 11A, multi-step attenuator 11B, antenna switching circuitry 13, and control lines 16A and 16B. The wide lines connecting the elements are indicative of microstrip circuitry on which high power RF circuits are typically implemented.

Transmitter 10 generates a high power RF signal which feeds into trim attenuator 11A. In the preferred embodiment, trim attenuator 11A is a ½ dB attenuator. Trim attenuator 11A may be any type of attenuator capable of the desired attenuation. The preferred embodiment uses a new shunt attenuator design.

Trim attenuator 11A includes input 20A, output 20B, capacitor 20C, resistor 20D, diode 20E and trim control line 16A. Capacitor 20C is of conventional design for blocking direct current. Resistor 20D is of conventional design and is selected to achieve the desired amount of attenuation. Diode 20E is preferably a high power diode and operates as a switch to turn the trim attenuator 11A on and off.

The output of trim attenuator 11A feeds into multi-step attenuator 11B. In the preferred embodiment in a TCAS system, the multi-step attenuator is also known as a whisper/shout attenuator.

Multi-step attenuator 11B is of conventional design and the preferred embodiment consists of five single step attenuation circuits, each of increasing level of attenuation. Each single step attenuation circuit consists of a pair of pin diode switches 21A–21E and a pi resistive network 22A–22E. The pin diode switches 21A–21E function together to turn each single step attenuation circuit on and off under the control of control lines 16B.

The pi resistive networks 22A–22E are of increasing attenuation of 1 dB, 2 dB, 4 dB, 8 dB, and 16 dB such that the multi-step attenuator 11B is capable of 32 steps of 1 dB attenuation each. High power pin diodes and pi resistive networks are known in the art and those skilled in the art can easily select appropriate resistive values for a desired application.

The output of multi-step attenuator 11B feeds into antenna switching circuitry 13 as described above.

Those skilled in the art recognize that this is merely one embodiment of an attenuator and control circuitry in accordance with the invention. Many alternate designs of trim and multi-step attenuators and control circuitry are known or are readily conceived by those skilled in the art. For example, trim attenuator 11A and multi-step attenuator 11B can be integrated together for some applications.

This description has been for descriptive purposes only and is not intended to limit the scope of the invention. Those skilled in the art will recognize numerous alternate embodiments of the invention which deviate from the described embodiment but still perform the same work in substantially the same way to achieve substantially the same result and are therefore equivalent to the invention.

It is clear from the foregoing that the present invention represents a new and useful method and apparatus for step attenuation of high power radio frequency signals.

The embodiments of an invention in which an exclusive property or right is claimed are defined as follows:

1. A precision calibrated step attenuator apparatus, comprising:

a) a multi-step attenuator having an input and an output;

b) a trim attenuator in communication with the input of said multi-step attenuator and an input for receiving a signal to be attenuated; and, c) a control unit in communication with said multi-step attenuator and said trim attenuator and including control memory operable to store calibration data specifying multi-step attenuator settings and trim attenuator settings for each attenuation step, said control unit being operable to generate control signals controlling said multi-step attenuator and said trim attenuator.

2. The precision calibrated step attenuator apparatus according to claim 1 wherein said control unit includes a calibration memory operable to store multiple sets of calibration data.

3. The precision calibrated step attenuator apparatus according to claim 2 further comprising a sensor in communication with said control unit, said sensor operable to measure a physical quantity and generate a sensor signal indicative thereof.

4. The precision calibrated step attenuator apparatus according to claim 3 wherein said sensor is a temperature sensor.

5. The precision calibrated step attenuator apparatus according to claim 1 wherein said trim attenuator is a shunt attenuator including, a) an input and an output, said input in communication with a transmitter and said output in communication with the output of said multi-step attenuator, and, b) a shunt portion connected between said input and ground, said shunt portion having a capacitor, resistor, and diode in series and a control line coupled between said diode and said input.

6. A calibrated attenuator system for attenuating high power RF transmitter signals, said attenuator system, comprising:
   a) RF attenuator means for attenuating an RF signal in a plurality of steps, said RF attenuator means including,
      1) multi-step attenuator means for attenuating a signal in a plurality of steps, and,
      2) trim attenuator means, in series with said step attenuator means, for attenuating a signal by less than one of said plurality of steps;
   b) sensor means for generating a sensor signal indicative of a physical quantity; and,
   c) control means in communication with said multi-step attenuator means and said trim attenuator means, said control means generating attenuation control signals as a function of calibration data and receiving said sensor signal with a means for receiving and altering said attenuation control signals in response thereof.

7. The calibrated attenuator system according to claim 6 wherein said sensor means is a temperature sensor.

8. The calibrated attenuator system according to claim 6 wherein said trim attenuator means is a shunt attenuator having,
   a) an input for receiving a signal to be attenuated,
   b) an output for communicating the attenuated signal,
   c) a shunt connecting said input to ground, said shunt including a capacitor, a resistor, and a diode all connected in series and forming a shunt between said input and ground, and,
   d) a trim control line coupled to said shunt between said diode and said input.

\* \* \* \* \*